United States Patent [19]

Takaoka et al.

[11] Patent Number: 5,412,865
[45] Date of Patent: May 9, 1995

[54] METHOD OF MANUFACTURING MULTILAYER ELECTRONIC COMPONENT

[75] Inventors: Tatsuru Takaoka; Kouichi Yagi; Yoshiaki Kohno, all of Kyoto, Japan

[73] Assignee: Murata Manufacturing Co., Ltd., Nagaokakyo, Japan

[21] Appl. No.: 88,274

[22] Filed: Jul. 7, 1993

Related U.S. Application Data

[63] Continuation-in-part of Ser. No. 938,394, Aug. 31, 1992, abandoned.

[30] Foreign Application Priority Data

Aug. 30, 1991 [JP] Japan .................. 3-219842

[51] Int. Cl.⁶ .................. H05K 3/36; H01G 7/00; B23P 19/00
[52] U.S. Cl. .................. 29/830; 29/464; 29/738; 29/760; 29/831; 29/851; 29/25.42; 29/610.1; 156/89; 156/235
[58] Field of Search .................. 29/25.35, 25.42, 464, 29/467, 610.1, 631.1, 738, 760, 830, 831, 846, 851; 156/230, 234, 235, 250, 256, 540, 541, 89; 264/58, 61, 67

[56] References Cited

U.S. PATENT DOCUMENTS

| | | | |
|---|---|---|---|
| 3,597,816 | 8/1971 | Zelenz | 29/25.42 |
| 5,009,744 | 4/1991 | Mandai et al. | 156/656 |
| 5,046,236 | 9/1991 | Wada et al. | 29/610.1 |
| 5,153,859 | 10/1992 | Chatigny et al. | 367/140 |
| 5,217,550 | 6/1993 | Takeuchi et al. | 156/541 X |
| 5,261,986 | 11/1993 | Kawabata et al. | 156/89 X |
| 5,316,602 | 5/1994 | Kogame et al. | 156/89 X |
| 5,356,512 | 10/1994 | Hosokawa | 156/230 X |

FOREIGN PATENT DOCUMENTS

| | | |
|---|---|---|
| 146036 | 6/1985 | European Pat. Off. . |
| 362404 | 4/1990 | European Pat. Off. . |
| 381879 | 8/1990 | European Pat. Off. . |
| 3941346 | 6/1990 | Germany . |
| 1-226131 | 9/1989 | Japan . |
| 2228368 | 8/1990 | United Kingdom . |

*Primary Examiner*—Tom Hughes
*Attorney, Agent, or Firm*—Ostrolenk, Faber, Gerb & Soffen

[57] ABSTRACT

A method of manufacturing a layered product to obtain a multilayer ceramic capacitor. A mother sheet supported by a carrier film is cut to obtain respective sheets to form a plurality of sheets. The sheets are transferred to a frame having inner dimensions capable of positioning the sheets inside the frame. The stacked sheets are then pressurized. The arrangement enables the sheets forming the layered product to be stacked for pressurizing without misalignment of internal electrodes embedded in the respective sheets and without air being entrapped between the stacked sheets.

16 Claims, 7 Drawing Sheets

METHOD OF MANUFACTURING MULTILAYER ELECTRONIC COMPONENT

CROSS-REFERENCE TO RELATED APPLICATION

This is a continuation-in-part of U.S. Ser. No. 07/938,394 filed Aug. 31, 1992, abandoned.

BACKGROUND OF THE INVENTION

1. Field of the Invention

The present invention relates to a method and an apparatus for manufacturing a multilayer electronic component that includes a layered product having a plurality of sheets. More particularly, the present invention relates to an improvement in the method of obtaining the layered product, which is included in the electronic component, and an apparatus thereof.

2. Description of the Background Art

Multilayer electronic components typically include multilayer ceramic electronic components, such as a multilayer ceramic capacitor, a multilayer ceramic substrate, a multilayer varistor, a multilayer piezoelectric element, and the like. In addition to the multilayer ceramic electronic components, multilayer electronic components include multilayer film electronic components, such as a multilayer film capacitor, which is made of an organic film.

Japanese Patent Laid-Open Application No. 1-226131 (1989) describes a method of manufacturing a multilayer ceramic electronic component. This prior art reference teaches the steps of forming patterned electrodes on a carrier film and forming a ceramic green sheet thereon so that the electrodes are embedded in the ceramic green sheet. The method further comprises the steps of thermocompression bonding the ceramic green sheet onto another ceramic green sheet or onto electrodes formed on another ceramic green sheet, and then separating the carrier film, thereby transferring the former ceramic green sheet onto the latter ceramic green sheet.

However, when the thickness of the ceramic green sheets, which are used in the multilayer ceramic capacitor, is reduced and the number of layers of the ceramic green sheets increased, so as to increase the capacitance and to reduce the size of the multilayer ceramic capacitor, the multilayer ceramic capacitors, which are obtained by the aforementioned prior art method, have certain drawbacks. For example, the internal electrodes are often extremely misaligned, in relation to each other, as a result of pressurization of the ceramic green sheets. FIG. 7 shows an example of such misalignment of the internal electrodes, in which, ceramic green sheets 1 provided with internal electrodes 2 are shown stacked on each other. When such misalignment occurs, the internal electrodes 2 could be improperly exposed in a later cutting step, or the multilayer ceramic capacitor formed could have insufficient capacitance.

SUMMARY OF THE INVENTION

Accordingly, an object of the present invention is to provide a method and an apparatus for manufacturing a multilayer electronic component that solves the aforementioned problems.

In one aspect, the present invention is directed to a method of manufacturing a layered product having a plurality of sheets for use in a multilayer electronic component. The method includes the steps of preparing a mother sheet, which is supported on a base, for obtaining the plurality of sheets, and a frame for receiving each of the plurality of sheets so as to align and stack the sheets, the frame defining an inner stacking area having dimensions sized for positioning the sheets therein and an upper rim surface of the frame surrounding the stacking area, a stacking table forming a bottom of the stacking area so as to define a depth of the stacking area, and means for adjusting the depth of the stacking area. The mother sheet is cut to dimensions corresponding to those of the frame to obtain the plurality of sheets from the mother sheet. The cut sheets are successively stacked in the frame by transferring them from the base onto the stacking area of the frame at a level at least as high as the upper rim surface of the frame whereby air in between the sheet being transferred and sheets previously stacked in the frame is eliminated. The stacked sheets are then pressurized in the frame. Each sheet is provided with a patterned conductor film. The conductor film may be applied to the sheet in the step of preparing a mother sheet, or by transferring the patterned conductor film to the sheet after the step of stacking the sheets by transfer from the base.

In another aspect of the present invention, an apparatus for manufacturing a layered product having a plurality of sheets for use in a multilayer electronic component is provided, comprising means for supporting a mother sheet for providing a plurality of sheets of a layered product; a frame for receiving each of the plurality of sheets so as to align and stack the sheets, the frame defining an inner stacking area having dimensions sized for positioning the sheets therein and an upper rim surface of the frame surrounding the stacking area, a stacking table forming a bottom of the stacking area so as to define a depth of the stacking area; means for adjusting the depth of the stacking area; means for cutting the mother sheet in dimensions corresponding to the inner dimensions of the frame to obtain respective ones of the plurality of sheets from the mother sheet; means for successively transferring and stacking the respective sheets at the stacking area of the frame by transferring them from the base to the frame, each of the plurality of sheets being transferred to the frame so as to contact a sheet previously stacked therein at substantially a level at least as high as the upper rim surface of the frame whereby substantially no air remains between the sheet being transferred and the previously stacked sheet when stacked; and means for pressurizing the stacked sheets in the frame to form a layered product.

According to the present invention, the plurality of sheets, which are obtained by cutting the mother sheet, are adjusted by the dimensions of the frame so as to be aligned and successively stacked with each other in the frame when transferred therein. Moreover, when the stacked sheets are pressurized in the frame, misalignment is prevented in the plurality of conductor films applied to the respective stacked sheets.

Thus, according to the present invention, it is possible to prevent misalignment of electrodes, or the like, which is caused when the stacked sheets are pressurized. When the present invention is applied to a multilayer ceramic capacitor, it is possible to prevent undesirable exposure of the internal electrodes, as well as insufficiency in capacitance, thereby obtaining a miniature multilayer ceramic capacitor having high capacitance.

In particular, when the mother sheet is cut along inner edges of the frame to obtain the respective sheets of the plurality of sheets, favorable results are obtained. The sheets so obtained are regulated, by the frame, so as to be aligned and successively stacked with each other in the frame when transferred therein. It is, therefore, possible to eliminate the factors that cause misalignment of the conductor films, which may be caused by misalignment of the stacked sheets.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENT

FIGS. 1(A) to 1(E) illustrate a first embodiment of the present invention.

Figure 1A:
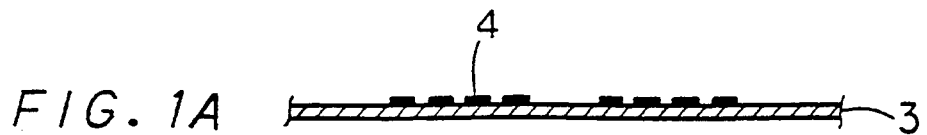
FIGS. 1(A) to 1(E) are sectional views of a method of manufacturing a multilayer ceramic capacitor according to one embodiment of the present invention.

Referring to FIG. 1(A), a paste containing Ag—Pd, Pt, Ni or Ag is screen-printed onto a carrier film 3, which is made of, for example, polyethylene terphthalate and serves as a base, thereby forming patterned internal electrodes 4 on the carrier film 3. The internal electrodes 4 may be dried at a temperature of 50° to 200° C. Such internal electrodes 4 may, alternatively, be formed by a method of vapor deposition or sputtering as described, for example, in U.S. Pat. No. 5,009,744.

Figure 1B:
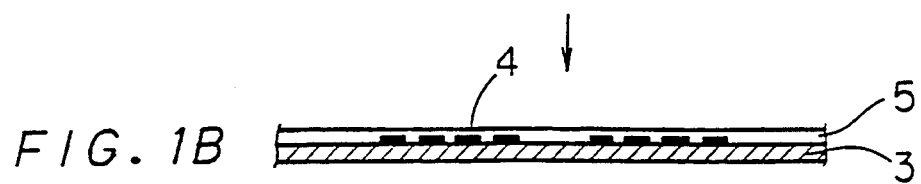

A ceramic green sheet 5 is formed on the carrier film 3, as shown in FIG. 1(B). At this time, the internal electrodes 4 are embedded in the ceramic green sheet 5. The ceramic green sheet 5 may be prepared using sheet-forming dielectric ceramic slurry which contains 10 to 20 percent by weight of a thermoplastic resin, such as butyryl resin.

Figure 1C:
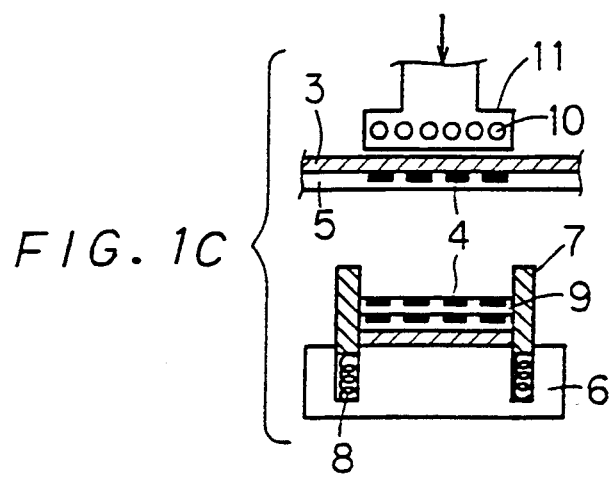

The ceramic green sheet 5, which is held by the carrier film 3, is arranged to face a stacking table 6, as shown in FIG. 1(C). The stacking table 6 includes a frame 7, which is vertically movable and is upwardly urged by the pressure of a spring 8. The frame 7 has inner dimensions that are sized for positioning sheets 9, which are to be stacked therein. A punch 11 containing a heater 10 is arranged above the ceramic green sheet 5 and the carrier film 3.

Figure 1D:
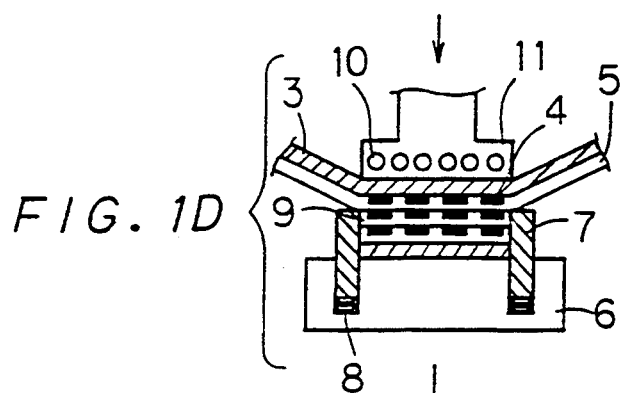

The punch 11 can be downwardly moved so that the ceramic green sheet 5 is thermocompression bonded to the uppermost sheet of the sheets 9, which have previously been stacked, as shown in FIG. 1(D). As a result of the downward pressure of the punch 11, the frame 7 is pushed down against the spring 8.

As a result of the downward movement of the frame 7, the gap between the uppermost stacked sheet 9 and the mother ceramic green sheet 5 is closed thereby expelling all air from in between the sheets. That is, the mother ceramic green sheet 5 supported on the base 3 is brought into contact with the upper surface of the uppermost stacked sheet 9 in the frame 7 at a level substantially the same as or higher than the upper rim surface of the frame 7. Accordingly, a closed space does not exist between the mother ceramic green sheet 5 and the uppermost stacked sheet 9 which could entrap air between the sheets of the layered product 12. The entrapment of air between the layers of the layered product 12 could lead to the formation of voids and hence cause defects in the stacked electronic component made from the layered product 12.

The ceramic green sheet 5, which is adapted to serve as a mother sheet from which each stacked sheet 9 is obtained, may be cut along inner edges at the top rim of the frame 7. As means for cutting each sheet 9, the inner edges at the top rim of the frame 7 may be knife-edged. The inner edges at the top rim of the frame 7 may, preferably, be formed by two planes joining at right angle or an acute angle. The ceramic green sheet 5 is generally made of a soft material and, therefore, can be easily cut by the inner edges of the top rim of the frame 7. The sheet 9 is then taken out from the ceramic green sheet 5.

According to this embodiment, the inner edges at the top rim of the frame 7 serve as cutting edges to cut the respective sheets 9 from the ceramic green sheet 5. Alternatively, means for cutting the ceramic green sheet 5 may be provided independently of the frame 7. As yet another alternative, the ceramic green sheet 5, which is held by the carrier film 3, may be provided, in advance of the step shown in FIG. 1(D), with cutting lines for defining the outline of each sheet 9. In this case, the ceramic green sheet 5 is not cut in this step. In the step shown in FIG. 1(D), the ceramic green sheet 5 may be brought into pressure contact with the uppermost sheet of the stacked sheets 9 at a temperature of 30° to 100° C. under a pressure of 50 to 250 kg/cm$^2$.

Figure 1E:
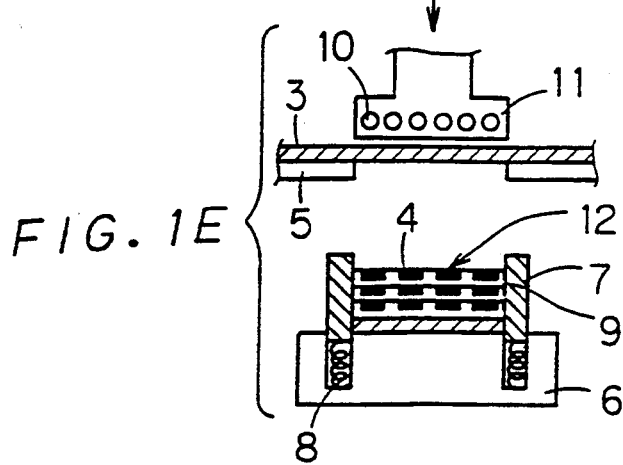

The punch 11 is then upwardly moved to return to its original position, as shown in FIG. 1(E). As a result, the carrier film 3 is also upwardly moved so as to be separated from the sheet 9. The sheet 9 is thereby taken out from the ceramic green sheet 5, and is transferred to and is stacked on top of the sheets 9 already stacked in the frame 7.

FIGS. 2A to 2F illustrate another embodiment of the present invention.

Figure 2A:
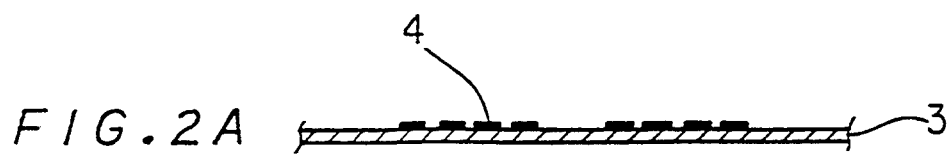
FIGS. 2(A) to 2(F) are sectional views of a method of manufacturing a multilayer ceramic capacitor according to another embodiment of the present invention.
Figure 2B:
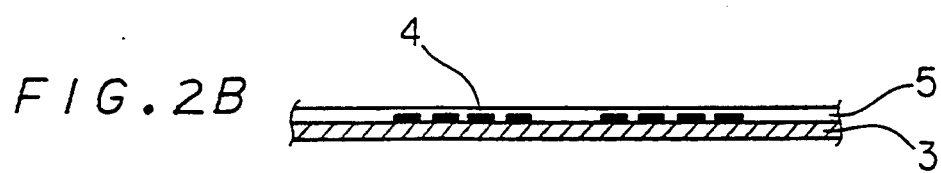
Figure 2C:
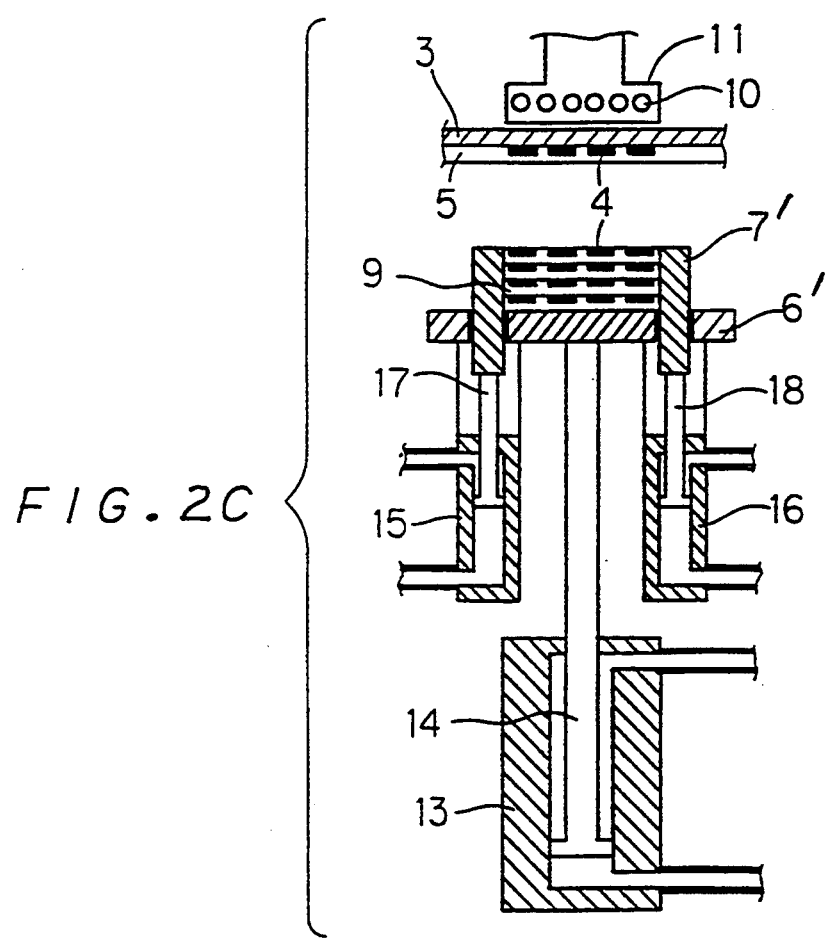

The mother ceramic green sheet 5 shown in FIGS. 2(A) and 2(B), which is held by the carrier film 3, is formed in a manner similar to that described above. The ceramic green sheet 5 is arranged to face a stacking table 6', as shown in FIG. 2C. The stacking table 6', in this embodiment, is coupled to a piston rod 14, which operates in a cylinder 13, driven by fluid pressure, such as air or oil, and movable in the upward and downward directions. The stacking table 6' holds a frame 7'. The frame 7' is coupled to piston rods 17 and 18, which operate in cylinders 15 and 16, also driven by fluid pressure. The cylinders 15 and 16 are attached to the stacking table 6'. Accordingly, the frame 7' is upwardly and downwardly movable with respect to the stacking table 6'. In addition, the respective positions of the stacking table 6' and the frame 7' in the vertical direction can be controlled by means of the cylinder 13 as well as the cylinders 15 and 16. Other reciprocating engines may also be used instead of the cylinders 13, 15 and 16 in the practice of this embodiment of the invention. The frame 7' has inner dimensions capable of locating sheets 9 to be stacked therein. A punch 11 containing a heater 10 is arranged above the ceramic green sheet 5 and the carrier film 3.

Figure 2D:
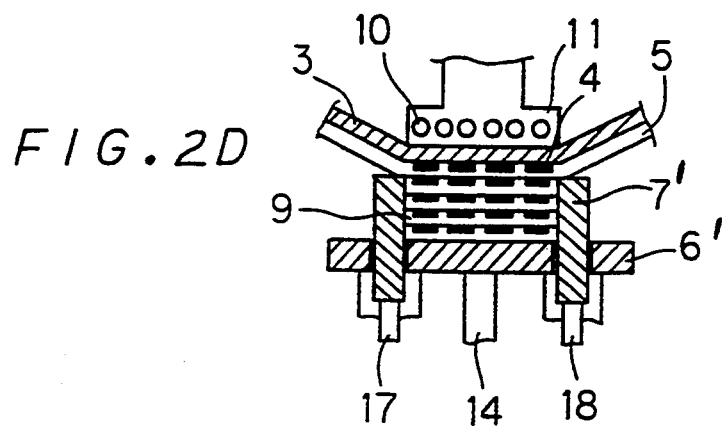

In this embodiment, the punch 11 may be downwardly moved and/or the stacking table 6' may be moved in the upward direction, so that the ceramic green sheet 5 is thermocompression-bonded onto the uppermost sheet of the sheets 9, which have already been stacked in the frame 7', as shown in FIG. 2D. The position of the frame 7' is controlled by the cylinders 15 and 16 such that the frame 7' is positioned with its upper end surface at the same level as or lower than the upper surface of the uppermost of the already stacked sheets 9. Accordingly, air present between the uppermost sheet of the stacked sheets 9 and the ceramic green sheet 5 can be easily and fully removed.

Figure 2E:
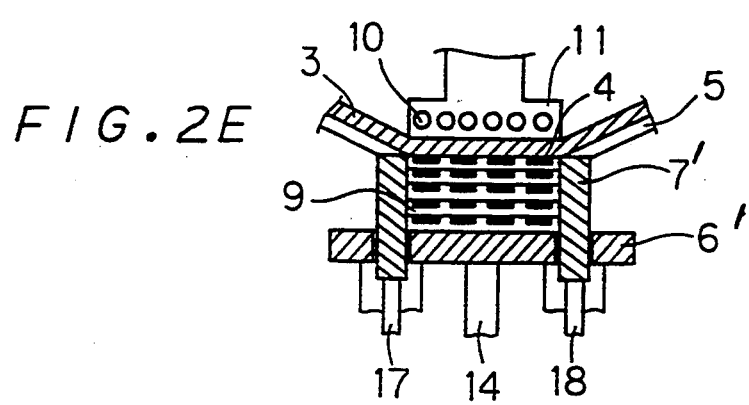

As shown in FIG. 2E, the frame 7' is moved in the upward direction by the pistons 17, 18 of the cylinders 15 and 16, thereby cutting the ceramic green sheet 5 along the inner edges of the top rim of the frame 7'. The cutting of the ceramic green sheet 5 may be done as described in the previous embodiment.

Figure 2F:
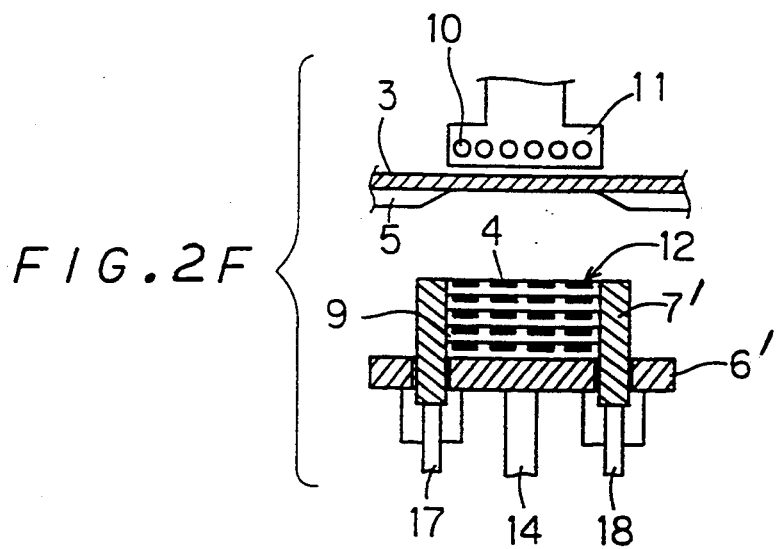

The punch 11 and/or the stacking table 6' are then returned to their original positions, as shown in FIG. 2F. As a result, the carrier film 3 is moved away from the stacked sheets 9 so as to be separated from the uppermost sheet 9 which is removed from the ceramic green sheet 5. The uppermost sheet 9 thus formed from the ceramic green sheet 5 is transferred and stacked as the uppermost one of the already stacked sheets 9 in the frame 7'.

The layered product 12, obtained in the aforementioned manner, is further cut to define chips for forming multilayer ceramic capacitors. Each chip is further fired and provided with external electrodes, to obtain the desired multilayer ceramic capacitors.

Tests were carried out to make a comparison/evaluation of the method according to the present invention and the prior art methods for manufacturing a layered product. In these tests, internal electrodes were designed so as to have pattern dimensions of 1.70 by 1.05 mm$^2$ after firing.

Figure 5:
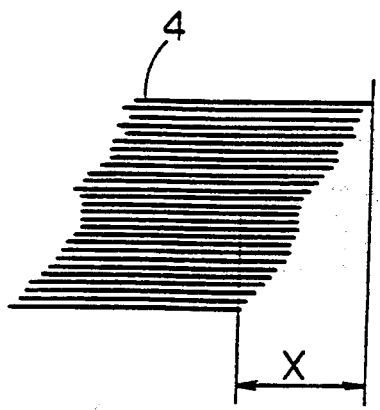
FIG. 5 shows cross-directional stacking misalignment of internal electrodes 4.
Figure 6:
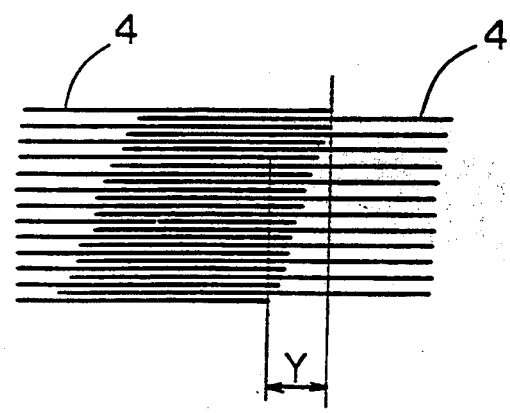
FIG. 6 shows longitudinal stacking misalignment of internal electrodes 4.
Figure 7:
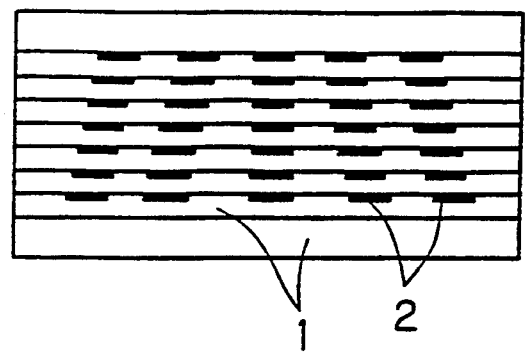
FIG. 7 is a sectional view showing misalignment of internal electrodes 2.

Table 1 shows values of misalignment caused in 50 layers and 100 layers of the internal electrodes, respectively. Referring to Table 1, the column "Direction W" shows values of cross-directional misalignment X of the internal electrodes 4, as shown in FIG. 5, and the column "direction L" shows values of longitudinal misalignment Y of the internal electrodes 4, as shown in FIG. 6.

TABLE 1

|  | Conventional Method | | Inventive Method | |
| --- | --- | --- | --- | --- |
|  | Direction W | Direction L | Direction W | Direction L |
| 50 Layers X [μm] | 150 | 125 | 35 | 24 |
| 3CV | 52.4 | 25.0 | 5.8 | 2.3 |
| 100 Layers X [μm] | 380 | 282 | 53 | 27 |
| 3CV | 62.4 | 28.0 | 7.2 | 3.8 |

[3CV = 3σ/x × 100]

According to the method of the present invention, it is possible to suppress misalignment by about 80 percent as compared with the conventional method in each case of 50 layers and 100 layers respectively, as shown by Table 1.

On the other hand, Table 2 shows cutting defect rates and capacitance values of chips obtained by cutting the layered products obtained by the conventional and inventive methods, respectively; each of which was formed with 100 layers of internal electrodes.

TABLE 2

|  | Conventional Method | Inventive Method |
| --- | --- | --- |
| Cutting Defect Rate | 38.0% | 0% |
| Capacitance X [μF] | 0.91 | 1.08 |
| 3CV | 25.3 | 5.2 |

As shown by Table 2, the conventional method exhibited a cutting defect rate of 38.0 percent, while the inventive method had absolutely no cutting defect. It is also understood that higher capacitance can be attained in the present invention as compared with the conventional method, with smaller dispersion.

FIGS. 3(A) to 3(F) illustrate another embodiment of the present invention. In FIGS. 3(A) to 3(F), elements corresponding to those shown in FIGS. 1(A) to 1(E) are denoted by similar reference numerals. This and the following embodiment are adapted to obtain a layered product by alternately transferring ceramic green sheets and internal electrodes, respectively.

Figure 3A:
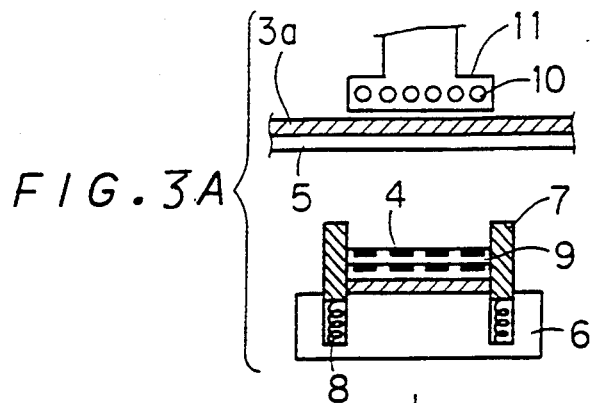
FIGS. 3(A) to 3(F) are sectional views of a method of manufacturing a multilayer ceramic capacitor according to yet another embodiment of the present invention.

Referring to FIG. 3(A), a ceramic green sheet 5, which is held by a carrier film 3a, is arranged between a stacking table 6 and a punch 11. No internal electrodes are embedded in this ceramic green sheet 5.

Figure 3B:
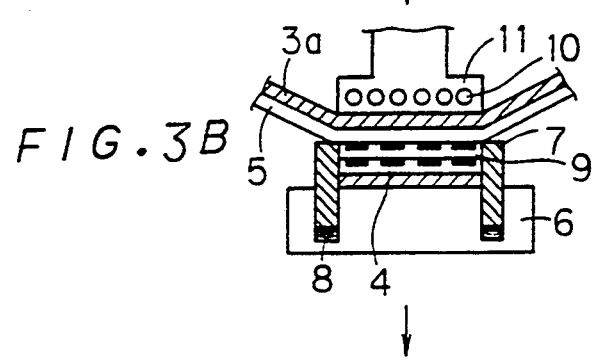

The ceramic green sheet 5 is thermocompression bonded to the uppermost sheet of sheets 9 which have already been stacked, as shown in FIG. 3(B). At the same time, the ceramic green sheet 5 is cut at the inner edges of the top rim of a frame 7. The ceramic green sheet 5 may also be cut by any of the methods previously described.

Figure 3C:
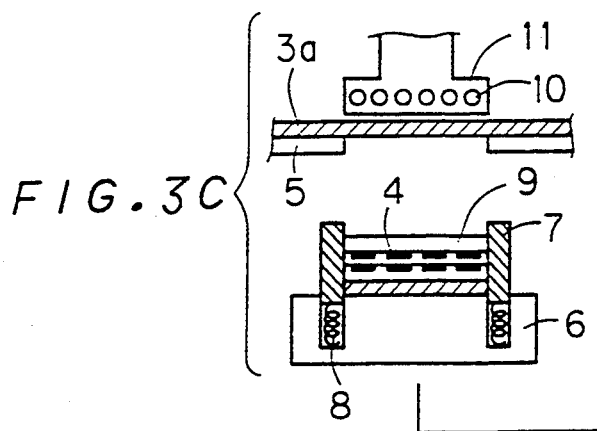

The sheet 9 thus formed is then separated from the carrier film 3a, as shown in FIG. 3(c).

Figure 3D:
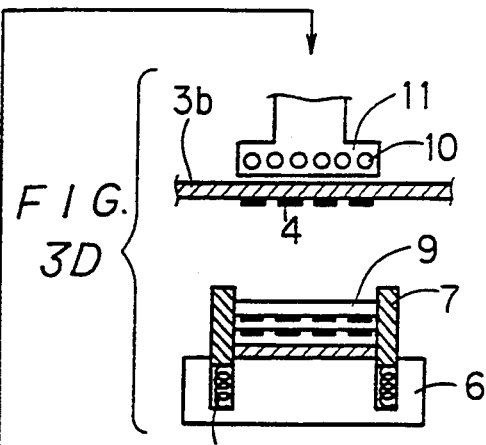

Internal electrodes 4 which are held on another carrier film 3b are now arranged between the stacking table 6 and the punch 11, as shown in FIG. 3(D).

Figure 3E:
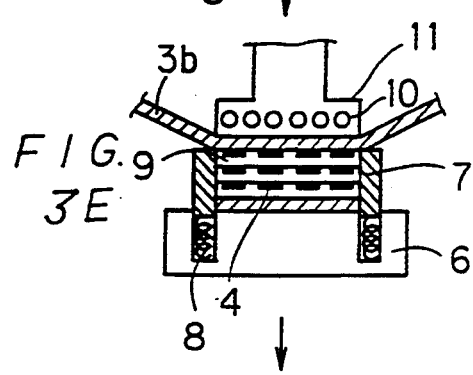
Figure 3F:
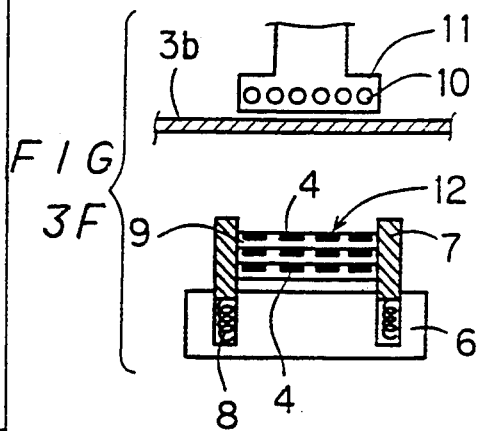

The internal electrodes 4 are thermocompression bonded to the uppermost sheet of the already stacked sheets 9, as shown in FIG. 3(E). At a result, the internal electrodes 4 are embedded in the uppermost sheet 9. The internal electrodes 4 are then separated from the carrier film 3b, as shown in FIG. 3(F).

In this manner, a plurality of sheets 9 and a plurality of internal electrodes 4 are successively and alternately transferred and stacked in the frame 7 and are pressurized in the frame 7, so as to obtain a layered product 12 similar to the embodiment shown in FIGS. 1(A) and 1(E).

FIGS. 4A to 4G illustrate yet another embodiment of the present invention. In FIGS. 4A to 4G, elements corresponding to those shown in FIGS. 2A to 2F are denoted by similar reference numerals. In this embodiment a layered product is obtained by alternately transferring ceramic green sheets and internal electrodes.

Figure 4A:
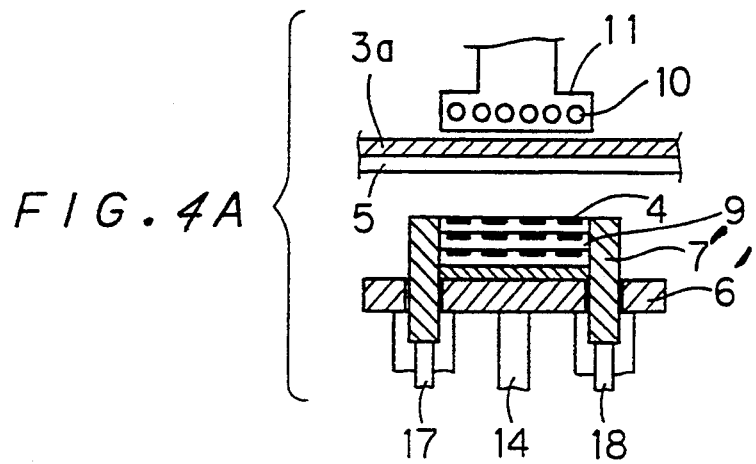
FIGS. 4(A) to 4(G) are sectional views of a method of manufacturing a multilayer ceramic capacitor according to yet another embodiment of the present invention.

Referring to FIG. 4A, a ceramic green sheet 5, which is held by a carrier film 3a, is arranged between a stacking table 6' and a punch 11. No internal electrodes are embedded in the ceramic green sheet 5.

Figure 4B:
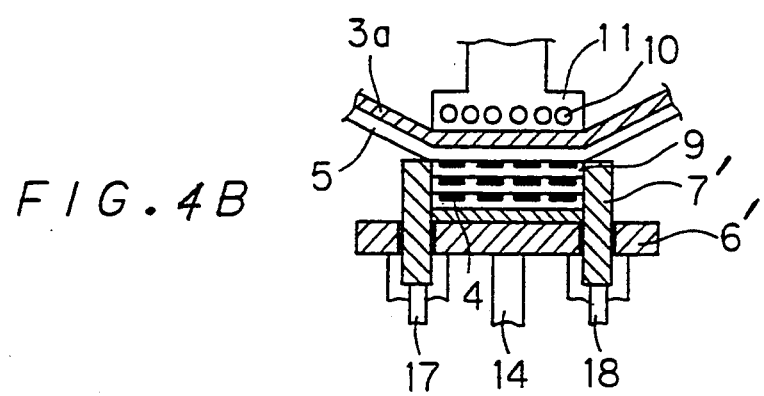

The ceramic green sheet 5 is then thermocompression-bonded onto the uppermost sheet of the sheets 9 which have already been stacked, as shown in FIG. 4B. The upper end surface of the frame 7' has already been positioned at the same level as or lower than the upper surface of the uppermost sheet of the stacked sheets 9. As a result, air present between the uppermost sheet of the sheets 9 and the ceramic green sheet 5 can be easily and fully removed.

Figure 4C:
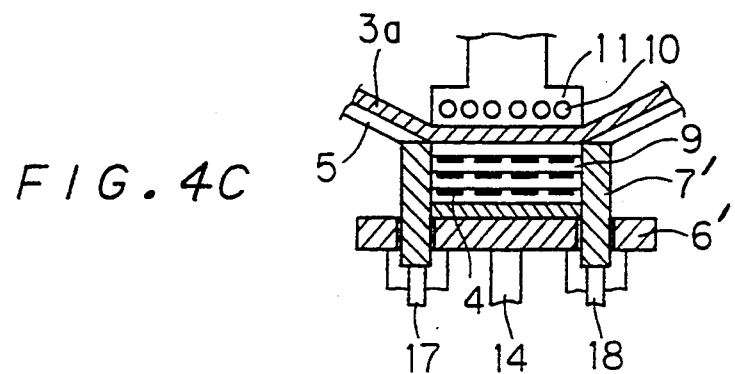
Figure 4D:
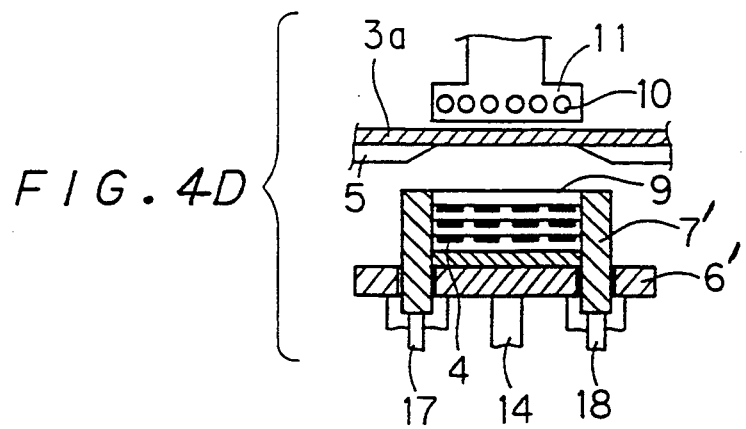

Then, as shown in FIG. 4C, the frame 7' is moved in the upward direction, and the ceramic green sheet 5 is cut along inner edges of the top rim of the frame 7'. The ceramic green sheet 5 may also be cut by any of the methods previously described. The sheet 9 thereby formed is then separated from the carrier film 3a, as shown in FIG. 4D.

Figure 4E:
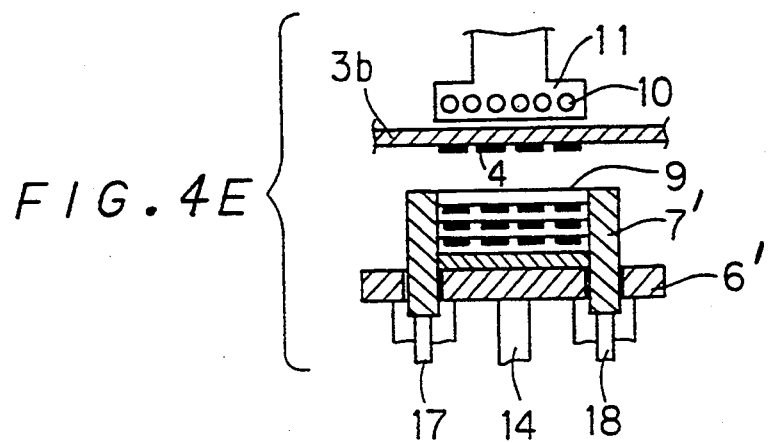
Figure 4F:
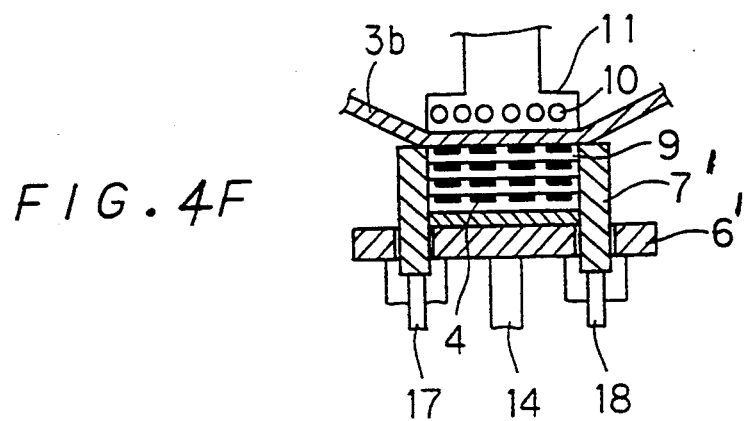
Figure 4G:
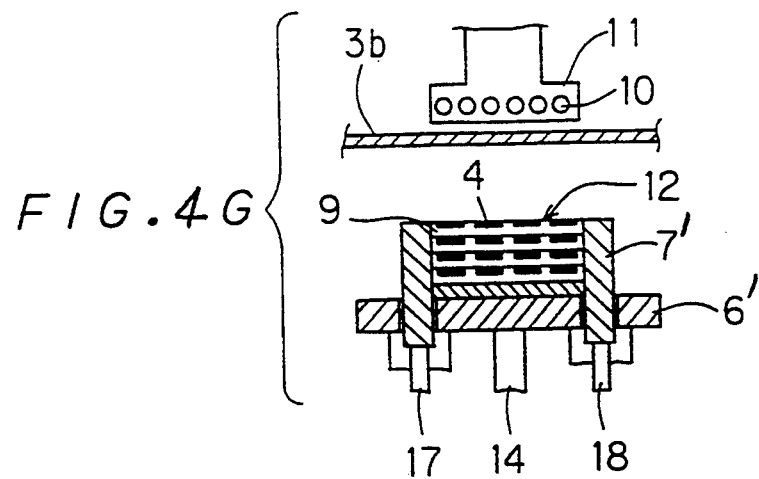

Internal electrodes 4, which are held on another carrier film 3b, are then arranged between the stacking table 6' and the punch 11, as shown in FIG. 4E. The internal electrodes 4, are thermocompression-bonded onto the uppermost sheet of the already stacked sheets 9, as shown in FIG. 4F. As a result, the internal electrodes 4 are embedded in the uppermost sheet of the stacked sheets 9. At this time also, the upper end surface of the frame 7' is positioned at the same level as or lower than the upper surface of the already stacked sheets 9. The internal electrodes 4 are then separated from the carrier film 3b, as shown in FIG. 4G.

Thus, a plurality of sheets 9 and a plurality of internal electrodes 4 are successively alternately stacked in the frame 7' by transfer and pressurized in the frame 7', to obtain a layered product 12 similar to the embodiment shown in FIGS. 2A to 2F.

Although embodiments of the present invention have been described in relation to a method of manufacturing a multilayer ceramic capacitor, the present invention can also be applied to various other multilayer electronic components such as multilayer ceramic electronic components including a multilayer ceramic substrate; a multilayer varistor; a multilayer piezoelectric element; and the like; and to multilayer film electronic components such as a multilayer film capacitor that is made of an organic film, and the like.

The carrier film employed as a base in each of the aforementioned embodiments may be replaced by a roll.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of manufacturing a layered product having a plurality of sheets for use in a multilayer electronic component, said method comprising the steps of:

preparing a mother sheet for providing a plurality of sheets of a layered product, said mother sheet being supported on a base;

applying patterned conductor films to said mother sheet;

preparing a frame for receiving each of said plurality of sheets so as to align and stack said sheets, said frame defining an inner stacking area having dimensions sized for positioning said sheets therein and an upper rim surface of said frame surrounding said stacking area, a stacking table forming a bottom of said stacking area so as to define a depth of said stacking area, means for adjusting the depth of said stacking area so as to bring a sheet previously stacked therein to a level at least as high as said upper rim surface of said frame;

moving said mother sheet supported on said base to said frame;

cutting said mother sheet in dimensions corresponding to said inner dimensions of said frame to obtain respective ones of said plurality of sheets from said mother sheet;

successively stacking each sheet of said plurality of sheets at said stacking area of said frame by transferring each sheet from said base, each sheet being transferred to said frame so as to contact said sheet previously stacked therein at substantially a level at least as high as said upper rim surface of said frame whereby substantially no air remains between said sheet being transferred and said previously stacked sheet when stacked; and pressurizing said stacked sheets in said frame so as to form a layered product.

2. A method of manufacturing a layered product in accordance with claim 1, wherein said step of applying conductor films to said mother sheet includes steps of forming said patterned conductor films on said base and then forming said mother sheet on said base to cover said conductor films.

3. A method of manufacturing a layered product in accordance with claim 1, wherein said mother sheet is a ceramic green sheet.

4. A method of manufacturing a layered product in accordance with claim 1, wherein said base is a film of resin.

5. A method of manufacturing a layered product in accordance with claim 1, wherein said upper rim surface of said frame includes inner edges capable of cutting said mother sheet, and said cutting step includes cutting said mother sheet with said inner edges of said frame to obtain respective ones of said plurality of sheets.

6. A method of manufacturing a layered product in accordance with claim 1, wherein said mother sheet includes cutting lines for cutting said mother sheet, and said cutting step includes cutting said mother sheet along said cutting lines to obtain respective ones of said plurality of sheets.

7. A method of manufacturing a layered product in accordance with claim 1, wherein said adjusting means comprises a spring attached to a lower end surface of said frame for vertically upwardly urging said frame, and said step of transferring said sheet comprises pressing down on said frame so as to downwardly move said frame against said spring so as to bring said previously stacked sheet to a level at least as high as said upper rim surface of said frame before transferring said sheet to said frame to stack said sheet therein.

8. A method of manufacturing a layered product in accordance with claim 1, wherein said adjusting means comprises hydraulic means attached to said frame and to said stacking table, respectively, so as to make said frame and said stacking table upwardly and downwardly movable with respect to each other, and said step of transferring said sheet comprises moving said frame and said stacking table relative to one another so as to bring said previously stacked sheet to a level at least as high as said upper rim surface of said frame before transferring said sheet to said frame to stack said sheet therein.

9. A method of manufacturing a layered product in accordance with claim 8, wherein said cutting step comprises moving said frame in an upwardly direction after moving said frame and said stacking table relative to one another so as to cut said mother sheet to obtain respective ones of said plurality of sheets, and then transferring said sheet to said frame so as to be stacked therein.

10. A method of manufacturing a layered product in accordance with claim 1, wherein said plurality of sheets are stacked by thermocompression bonding onto said previously stacked sheet.

11. A method of manufacturing a layered product having a plurality of sheets for use in a multilayer electronic component, said method comprising the steps of:
 preparing a mother sheet for providing a plurality of sheets of a layered product, said mother sheet being supported on a base;
 preparing a frame for receiving each of said plurality of sheets so as to align and stack said sheets, said frame defining an inner stacking area having dimensions sized for positioning said sheets therein and an upper rim surface of said frame surrounding said stacking area, a stacking table forming a bottom of said stacking area so as to define a depth of said stacking area, means for adjusting the depth of said stacking area so as to bring a sheet previously stacked therein to a level at least as high as said upper rim surface of said frame;
 moving said mother sheet supported on said base to said frame;
 cutting said mother sheet in dimensions corresponding to said inner dimensions of said frame to obtain respective ones of said plurality of sheets from said mother sheet;
 successively stacking each sheet of said plurality of sheets at said stacking area of said frame by transferring each sheet from said base, each sheet being transferred to said frame so as to contact said sheet previously stacked therein at substantially a level at least as high as said upper rim surface of said frame whereby substantially no air remains between said sheet being transferred and said previously stacked sheet when stacked;
 pressurizing said stacked sheets in said frame;
 preparing a patterned conductor film, said patterned conductor film being supported on a second base; and
 transferring said conductor film onto said stacked sheets to form a layered product.

12. A method of manufacturing a layered product in accordance with claim 11, wherein the step of stacking each sheet of said plurality of sheets by transfer and the step of transferring said conductor film onto said stacked sheets are alternately repeated.

13. A method of manufacturing a layered product according to claim 11, wherein said mother sheet is a ceramic green sheet.

14. A method of manufacturing a layered product in accordance with claim 11, wherein said base is a film of resin.

15. A method of manufacturing a layered product in accordance with claim 11, wherein said upper rim surface of said frame includes inner edges capable of cutting said mother sheet, and said cutting step includes cutting said mother sheet with said inner edges of said frame to obtain respective ones of said plurality of sheets.

16. A method of manufacturing a layered product in accordance with claim 11, wherein said mother sheet includes cutting lines for cutting said mother sheet, and said cutting step includes cutting said mother sheet along said cutting lines to obtain respective ones of said plurality of sheets.

* * * * *